US005329202A

United States Patent [19]

Garlick et al.

[11] Patent Number: 5,329,202

[45] Date of Patent: Jul. 12, 1994

[54] LARGE AREA ULTRASONIC TRANSDUCER

[75] Inventors: George F. Garlick; Todd F. Garlick, both of Kennewick, Wash.

[73] Assignee: Advanced Imaging Systems, Richland, Wash.

[21] Appl. No.: 796,466

[22] Filed: Nov. 22, 1991

[51] Int. Cl.[5] .............................................. H01L 41/08

[52] U.S. Cl. .................................... 310/334; 310/335; 310/363; 310/364; 310/327

[58] Field of Search ............... 310/334, 335, 336, 337, 310/322, 363, 364, 365, 357, 358, 326, 327

[56] References Cited

U.S. PATENT DOCUMENTS

| | | | |
|---|---|---|---|
| 3,585,847 | 6/1971 | Brenden | 73/67.6 |
| 4,217,684 | 8/1980 | Brisken et al. | 310/334 |
| 4,365,515 | 12/1982 | Abts | 310/334 X |
| 4,443,733 | 4/1984 | Samodovitz | 310/365 X |
| 4,460,841 | 7/1984 | Smith et al. | 310/334 |
| 4,509,153 | 4/1985 | Weight | 310/365 |
| 5,045,746 | 9/1991 | Wersing et al. | 310/334 |
| 5,101,133 | 3/1992 | Schafer | 310/335 |
| 5,103,129 | 4/1992 | Slayton et al. | 310/335 |

*Primary Examiner*—Mark O. Budd
*Attorney, Agent, or Firm*—Wells, St. John, Roberts, Gregory & Matkin

[57] ABSTRACT

The description details a preferred embodiment of an improved large area ultrasonic transducer 70 capable of reducing the generation of adverse "edge effect" waves. The transducer has a thin piezoelectric wafer 72 that has a high area-to-thickness ratio of preferably between 30 and 300. A front electrode coating 84 is deposited on the front surface 74, over the front edge 77, along the side surface 82 and over the back edge 78 and onto a border of the back surface 76 to minimize the application of a voltage potential along the side surface.

A voltage modifying layer 92 is placed on the back surface 76 along the back edge 78 for further minimizing the generation of "edge effect" waves. The layer 92 varies in thickness to progressively decrease the voltage applied to the back surface 76 from a large central area 79(*a*) to the back edge 78. The layer 92 is preferably composed of a non-piezoelectric dielectric material.

22 Claims, 5 Drawing Sheets

LARGE AREA ULTRASONIC TRANSDUCER

TECHNICAL FIELD

This invention relates to ultrasonic transducers and more particularly to large area ultrasonic transducers for generating plane waves with minimal edge effect distortion for use in ultrasonic holography.

BACKGROUND OF THE INVENTION

Although commercial application of ultrasonic holography has been actively pursued by many persons in the scientific and industrial communities for many years, only limited results have been obtained even though it was once thought that ultrasonic holography held great promise. It was felt that the application of ultrasonic holography was particularly applicable to the fields of non-destructive testing of materials and medical diagnostics of soft tissues that are relatively transparent or translucent to ultrasonic radiation. One of the principal problems that has been encountered and not effectively resolved is the difficulty of obtaining visible results having high resolution content.

Solutions to this problem have been elusive, in part because of the difficulty in identifying the many causes that contribute to the problem. One culprit that is believed to materially contribute to the problem has been the difficulty of generating undistorted ultrasonic plane waves from a large surface piezoelectric transducer. It has been suggested that "edge effect" radiation from the side and edges of the piezoelectric wafer materially interferes with and adversely affects the ability of the transducer to generate undistorted plane waves for insonifying the subject object. To illustrate this point, reference is made to a typical prior art ultrasonic holography system that is schematically shown in FIGS. 1 and 2.

Such a typical "real time" ultrasonic holographic system is generally identified in FIG. 1 with numeral 10. The system 10 is intended to inspect the interior of an object 12. The system 10 generally has a hologram generating sub-system 13 and a hologram viewing subsystem (optical sub-system) 32. One of the principal components and the main subject of the focus of this invention is the provision of ultrasonic transducers, generally referred to as the object transducer 14 for generating ultrasonic plane waves 16 for insonifying the object 12 and reference transducer 22 for generating an off-axis beam.

The ultrasonic energy transmitted through the object 12 is directed to a hologram detection surface 18, which is generally an area of a liquid-gas interface or liquid surface, such as a water surface. Generally the hologram detection surface 18 is physically isolated in a detection container 20 to minimize distortions caused by vibration. The ultrasonic reference transducer 22 generates an off-axis ultrasonic beam that is also directed to the hologram detection surface 18 to form a standing hologram. It is frequently desirable to pulse the transducers 14 and 22 at desired intervals to minimize dynamic distortions of the detector surface 18.

Generally an ultrasonic lens assembly 26 is utilized to provide a focused hologram of a desired plane 27 within the object 12. In the example shown, the assembly 26 has a stationary lens 28 having a focal length coincident with the plane of the hologram detection surface 18. A movable complementary lens 30 is provided to be moved to focus on the desired object plane 27 of the object 12.

The optical subsystem 32 includes a source of coherent light, preferably a laser 34 for generating a beam of coherent light. The laser light beam is directed through a laser lens 36 to achieve a point source that is located at or near the focal point of a collimating lens 38 and then onto the hologram detector surface to illuminate the hologram. The reflected coherent light radiation containing holographic information is directed back through the optical lens 38 and separated into precisely defined diffracted orders in the focal plane of the collimating lens 38. A filter 42 is used to block all but a first order pattern 44 for "real time" observation by a human eye 46 or an optical recorder, such as a video recorder.

As illustrated in FIG. 1, the prior art ultrasonic transducers, in addition to generating plane waves 16, generate edge effect waves 48 that adversely interfere with the fidelity of the plane waves 16 which causes a reduction in the resolution and clarity of the produced hologram. FIG. 2 illustrates the distortions in the plane waves. FIG. 2 illustrates the energy profile 52 of the plane wave emanating from the front face of the transducer 14. The energy profile or curve 52 has dramatic end or edge curve sections 54 showing the sharp decrease in the power levels at the edges of the transducer. The curve 52 also shows an irregular and distorted central plateau 60 of the wave form indicating the adverse interference of the edge effect waves distorting the plane waves emanating from the front face of the transducer.

A principal objective of this invention to provide an ultrasonic transducer that materially reduces the generation of disruptive edge effect sound waves. The present invention more nearly operates closer to the more ideal condition illustrated in FIG. 3, having a power wave form distribution across the face of the transducer with a uniform, undistorted central section 60 with gradually decreasing transition segments 64 and 66 toward the transducer edges.

These and other objects and advantages of the present invention will become apparent upon reading the following description of the preferred and alternate embodiments of the present invention.

BRIEF DESCRIPTION OF THE DRAWINGS

Preferred embodiments of the invention are described below with reference to the accompanying drawings, which are briefly described below.

DETAILED DESCRIPTION OF THE PREFERRED EMBODIMENTS

This disclosure of the invention is submitted in furtherance of the constitutional purposes in U.S. Patent Laws "to promote the progress of science and useful arts" (Article 1, Section 8).

Figure 5:
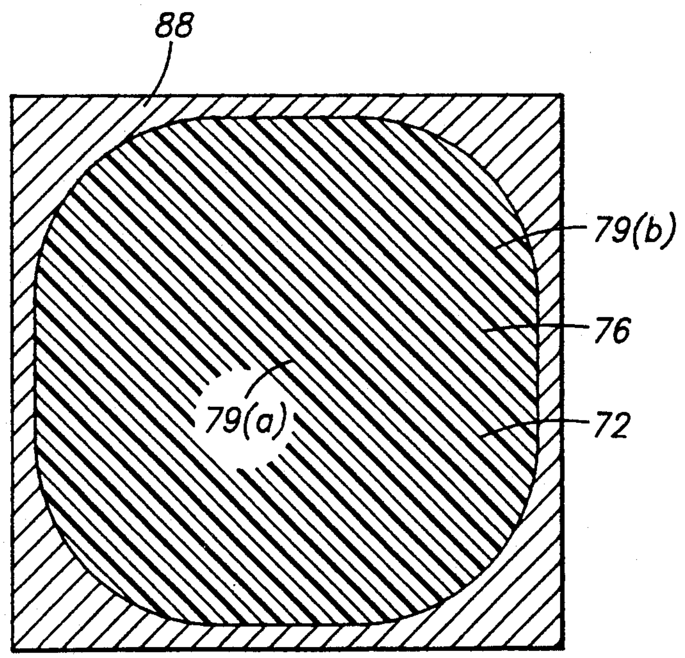
FIG. 5 is a plan view of an alternate embodiment illustrating a large area ultrasonic transducer having a square shape.
Figure 6:
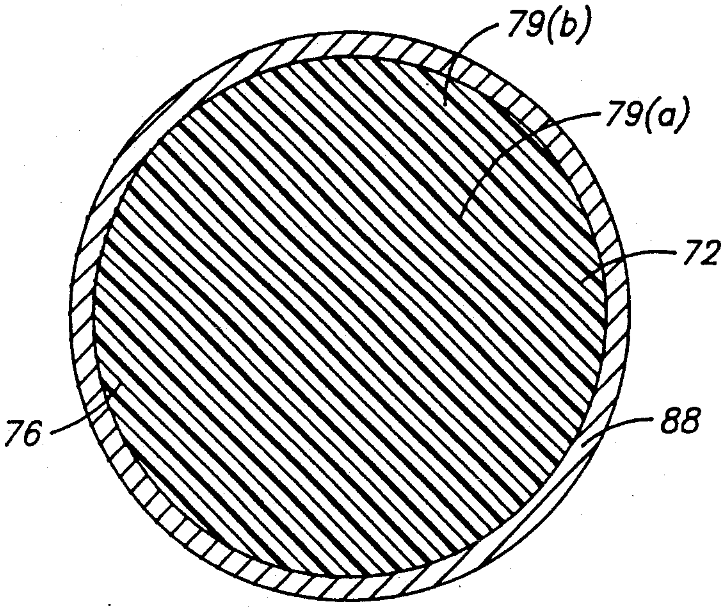
FIG. 6 is a plan view of an additional embodiment illustrating a large area ultrasonic transducer having a circular shape.

A preferred embodiment of this improved ultrasonic transducer invention is illustrated in FIGS. 4 and 7-10. FIGS. 5 and 6 illustrate alternative embodiments. The improved ultrasonic transducer is generally identified with the numeral 70.

Figure 7:
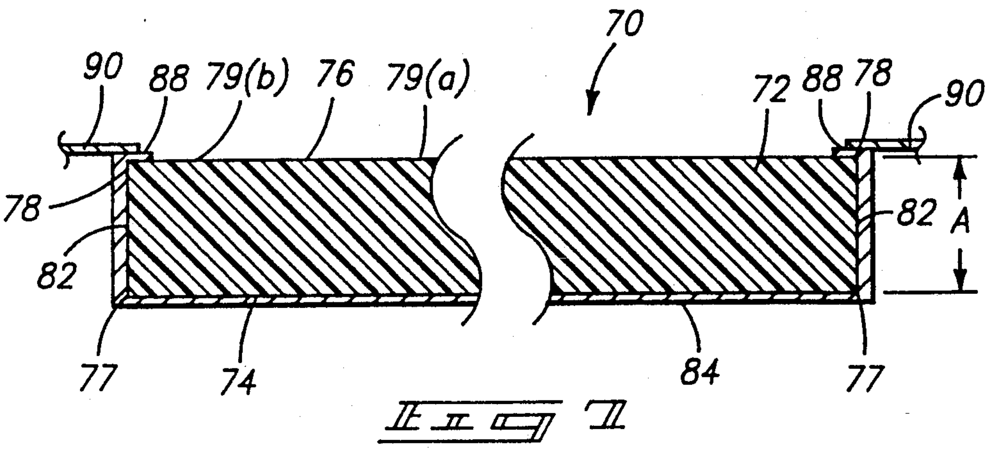
FIG. 7 is a vertical cross sectional view taken along line 7—7 in FIG. 4 illustrating the front electrode coating extending across a front surface of the piezoelectric wafer and then along the peripheral side surfaces to the edge boundary on the back surface.
Figure 8:
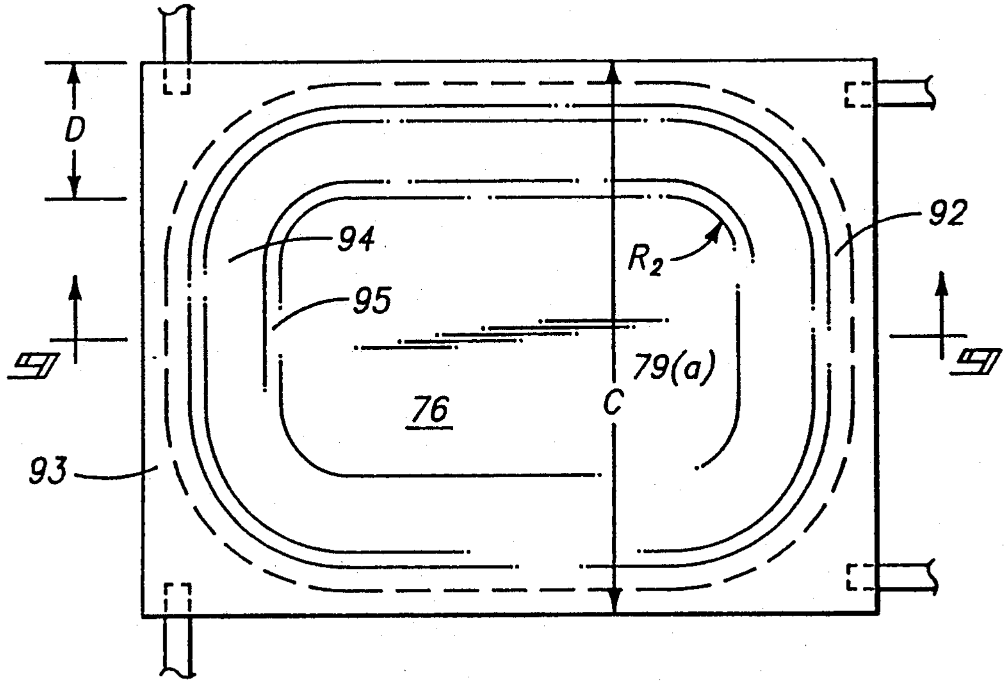
FIG. 8 is a figure similar to FIG. 4 except showing a perimeter layer of voltage modifying material on the back surface overlaying the front electrode coating along the back edge.
Figure 9:
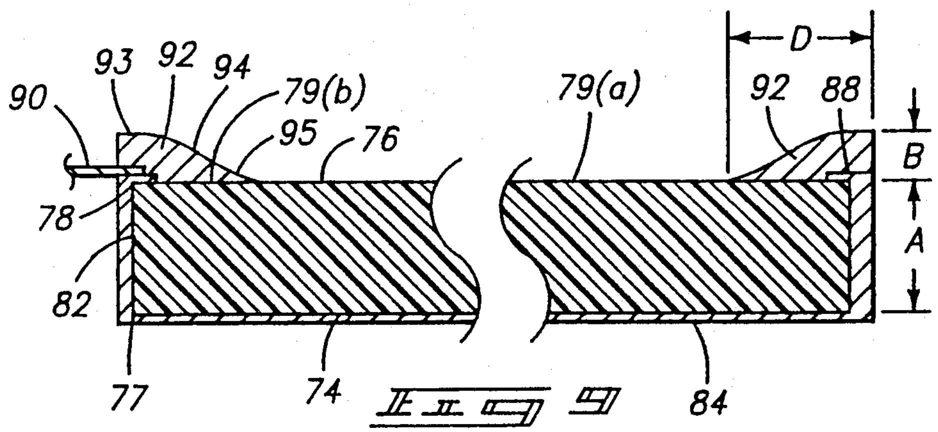
FIG. 9 is a vertical cross sectional view taken along line 9—9 in FIG. 8 illustrating the tapered thickness of the voltage modifying layer as the layer extends from the edge toward a central area of the back surface of piezoelectric wafer.
Figure 10:
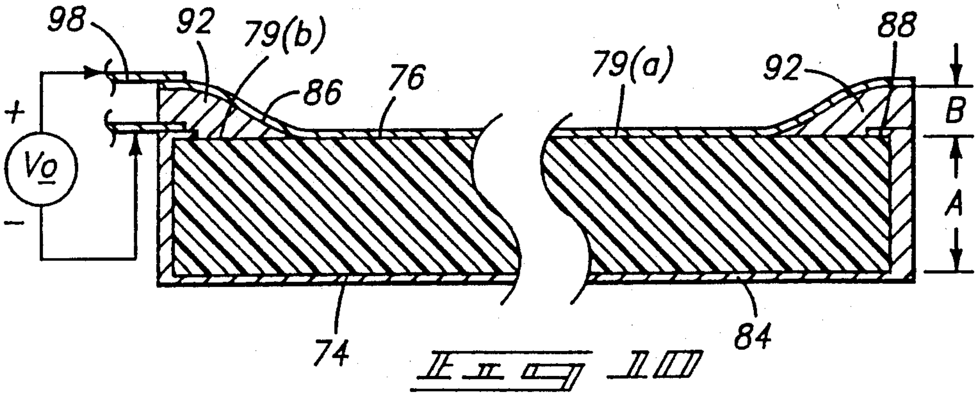
FIG. 10 is a vertical cross sectional view similar to FIG. 9 except showing the addition of a back electrode layer covering the back surface of the piezoelectric wafer and the voltage modifying layer.

The ultrasonic transducer 70 has a thin piezoelectric polycrystalline body or wafer 72 with large area parallel front and back face surfaces 74 and 76 respectively (FIG. 7). The front face surface 74 extends outward to a back perimeter edge 77. The back face surface 76 extends outward to a back perimeter edge 78. The back face surface 74 has a large central area 79(*a*) and a surrounding perimeter area 79(*b*) that extends from the central area 79(*a*) to the back perimeter edge 78. The wafer 72 also includes a narrow perimeter side surface 82 that extends about the perimeter of the wafer 72 between the front and back edges 77 and 78.

The piezoelectric wafer 72 is preferably composed of a polycrystalline ceramic oxide material exhibiting a high degree of piezoelectric activity. Preferably the polycrystalline ceramic oxide material comprises lead zirconate titanate, generally referred to as PZT piezoelectric material. Specific formulations referred to as PZT-7A and PZT-5A have been successfully employed. The dielectric constant of such PZT material is approximately 425.

The ultrasonic transducer 70 is designed to generate ultrasonic radiation at a frequency of between 2 megHz. and 5 megHz. Preferably the wafer 72 has a thickness "A" between the front and back face surfaces of between 0.017 and 0.041 inches. Optimally the thickness "A" is between 0.020 and 0.030 inches. Good results have been obtained using a wafer 72 having a thickness "A" of approximately 0.024-0.025 inches.

It is quite desirable to provide an ultrasonic transducer 70 having the capability of generating large area plane waves to ultrasonically inspect rather large objects 12 or large internal areas of an object 12. Preferably the transducer 70 is a lager area ceramic piezoelectric transducer in which the wafer 72 has large face surfaces 74, 76 with a minimum face surface dimension "C" greater than 1.5 inches. Preferably the minimum face surface dimension "C" is greater than 3 inches and optimally between 3 and 6 inches. The minimum face surface dimension "C" should be more than 30 times greater than the thickness "A" and preferably between 30 and 300 times greater than the thickness "A".

Figure 4:
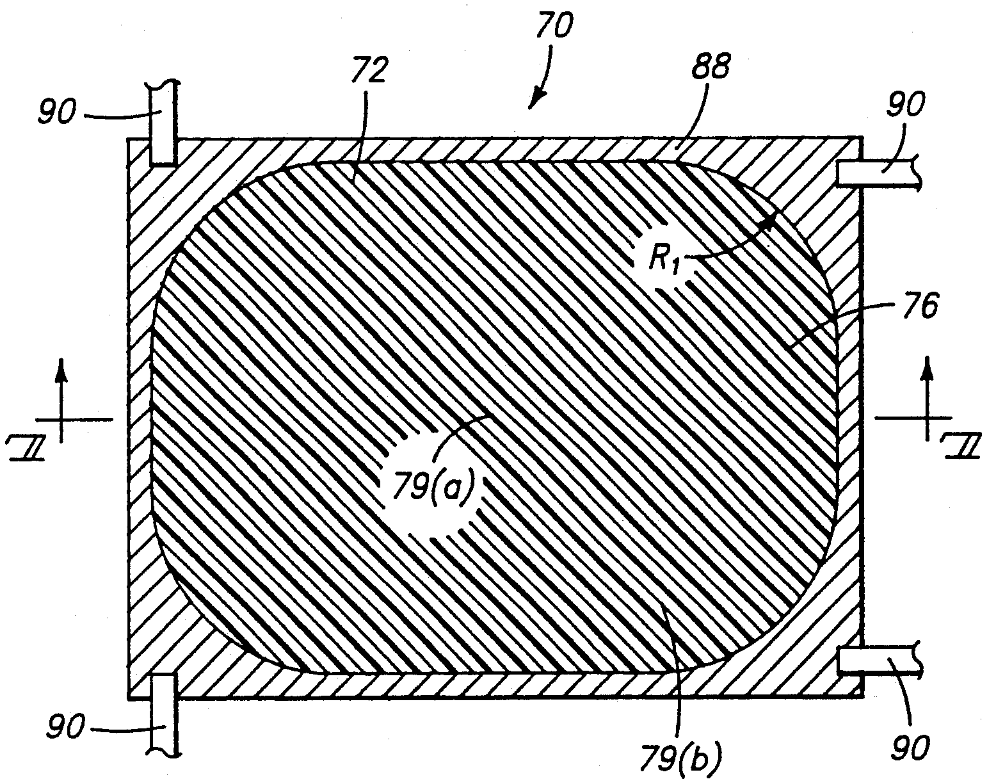
FIG. 4 is a plan view of a preferred embodiment of the subject invention showing a large area ultrasonic transducer of a rectangular shape in a preliminary stage of manufacture, illustrating a back surface of a piezoelectric wafer with a front electrode coating extending along an edge boundary of the piezoelectric substrate.

FIG. 4 illustrates a rectangular shaped large surface transducer 70 having minimum and maximum surface dimensions of between 3 and 8 inches. Alternatively, the transducer 70 may be constructed having a square shape as illustrated in FIG. 5 or a circular shape as illustrated in FIG. 6.

The ultrasonic transducer 70 has a front electrode coating 84 and a back electrode coating 86 applied to the respective front and back surfaces 74, 76 of the wafer 72 to enable the oscillation voltage to be applied to generate the desired large area ultrasonic plane waves. Preferably the electrode coatings 84, 86 completely overlay the respective front and back surfaces 74, 76 and have a uniform thickness of approximately 0.0003-0.0005 inches.

The front electrode coating 84 preferable extends from the front face surface 74 over the front edge 77 and along the peripheral side surface 82 and then over the back edge 78 and onto the back surface forming a perimeter front electrode border 88 along the back surface edge 78. Such a continuous coating electrically combines the side surface 82 and the edges 77, 78 to the front surface 74 and minimizes the application of an excitation voltage at the side surface 82 to thereby minimize the generation of interfering ultrasonic waves from the edges 78, 80 and side surface 82. As illustrated in FIG. 4, the border 88 extends along the back edge 78 forming smooth radius at the corners. Preferably the border 88 has an inside radius of curvature $R_1$ at the corners that is greater than 10 times the thickness "A" of the wafer 72.

The ultrasonic transducer 70 has front electrode connector tabs 90 affixed to the front electrode coating 84 for applying a voltage to the front surface 74. Preferably the tabs 90 are affixed to the front electrode coating 84 along the border 88 as illustrated in FIG. 4. Thus, the tabs 90 do not interfere with the generation of the plane waves from the front surface 74. In a preferred embodiment, the tabs 90 are rather evenly spaced to enable an even application of voltage to the entire front face electrode coating 84.

The ultrasonic transducer 70 importantly has a voltage modifying or reduction layer 92 interposed between the back face surface 76 and the back electrode coating 86 along the back edge 78 to reduce the effective voltage applied to the face surface 76 adjacent the side surface 82. Such a radiation is illustrated ideally in FIG. 3, to further minimize the generation of interfering edge effect ultrasonic waves from the side surface 82. Preferably the voltage reduction layer 92 surrounds the large central portion 79(*a*) of the back surface 76 and overlies the perimeter portion 79(*b*).

The voltage reduction layer 92 (FIGS. 8 and 9) has a width "D" extending from the back edge 78 over the perimeter portion 79(*b*) to the large central portion 79(*a*). Preferably, the width "D" is between 5 and 20 times the thickness "A" of the wafer 72. Optimally, the width "D" is between 10 and 20 times the thickness "A" of the wafer 72.

The maximum thickness "B" of the layer 92 is substantially less than the thickness of the wafer 72 and is preferably between 0.005 and 0.010 inches. The thickness "B" of the layer 92 varies from a maximum adjacent the back edge 78 to a minimum at central portion 79(*a*) of the back surface 76. Preferably the thickness "b" varies in a tapered pattern from the back edge 78 to the central portion 79(*a*) and more preferably varies similarly to a "bell shaped" Guassian curve illustrated in FIGS. 3, 8 and 9. The layer 92 preferably has (1) a gradual thickness decreasing first section 93, (2) a more rapid thickness decreasing second section 94, and (3) a flared thickness decreasing third section 95, extending from the edge 78 and terminating at the central portion 79(*a*). It should be noted that the layer 92 extends over the electrode border 88 to provide a insulating material between the electrode coatings 84 and 86 adjacent the back edge 78.

Figure 1:
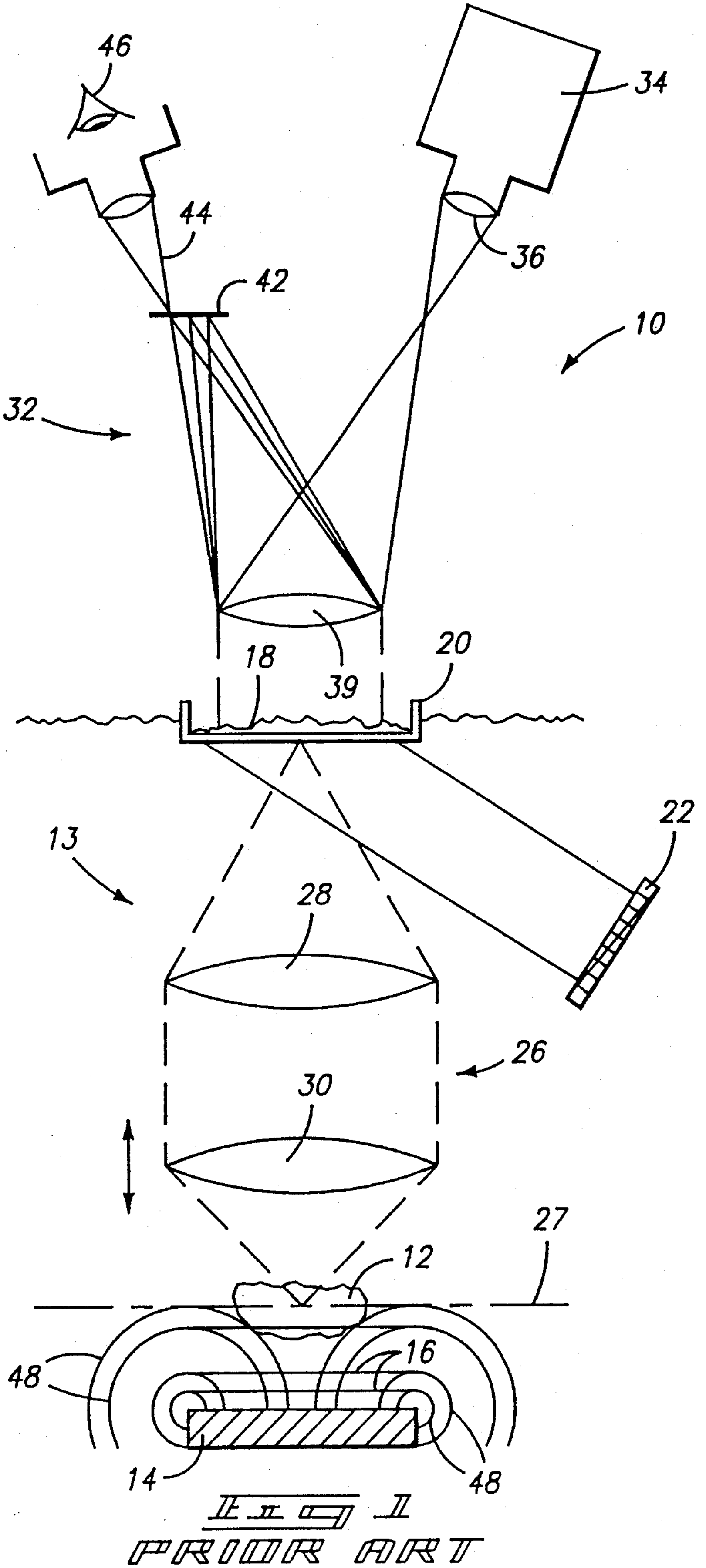
Fig 1 PRIOR ART
FIG. 1 is a schematic of a ultrasonic holographic system illustrating a prior art ultrasonic transducer that generates adverse edge effect waves that causes distortion in the plane wave pattern generated by the ultrasonic transducer.
Figure 2:
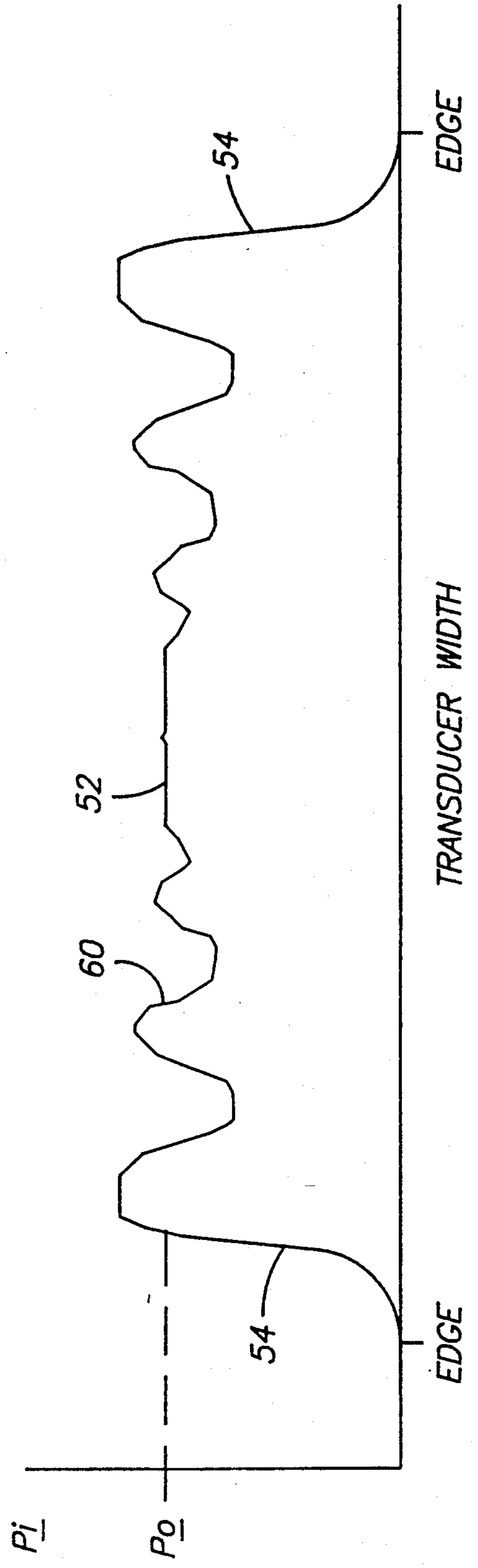
FIG. 2 PRIOR ART
FIG. 2 is a conceptual graph illustrating a power curve across the front face of the prior art ultrasonic transducer showing the non-uniform power distribution level caused by the interfering non-planar waves generated at the edge of the transducer.
Figure 3:
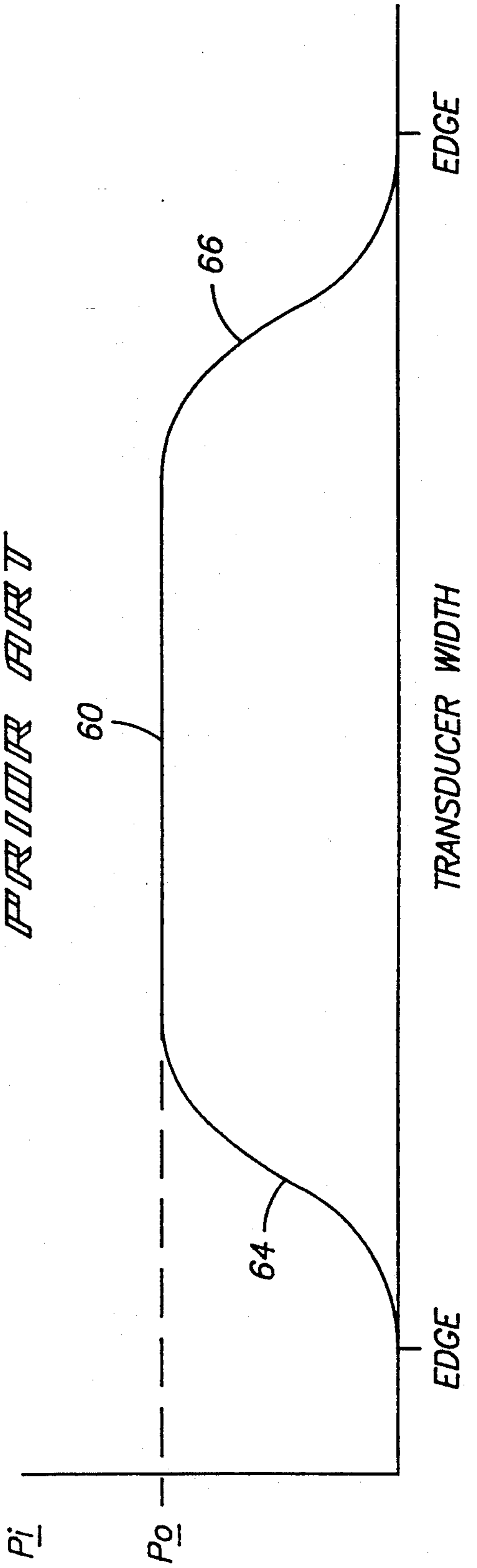
FIG. 3 is a conceptual graph illustrating an ideal power curve across the front face of an ideal ultrasonic transducer in which the adverse edge effect has been illuminated.

The voltage reduction layer 92 is composed of a material that is substantially less conductive than the electrode coating material and provides a substantial electrical impedance between the back electrode and the back surface adjacent the back edge 78 to reduce the exciting voltage at the side surface 82 to less than 50% of that applied at the large central area 79(*a*) and preferably less than 25%. It is important that the voltage reduction be rather gradual as illustrated in FIG. 3.

Preferably the layer 92 comprises a non-piezoelectric dielectric material, such as an synthetic epoxy resin. In alternate embodiments, metallic particles may be added to the epoxy resin to decrease its resistivity and increase the voltage drop across the thickness of the layer 92. The composition of the layer 92 may vary considerably to obtain the desired results. The voltage reduction layer 92 preferably has an electrical dielectric constant of between 3 and 100 and an electrical volume resistivity value of between 0.1 ohm-cm. and $2.5\times10^{15}$ ohm-cm. More preferred, the voltage reduction layer 92 comprises a synthetic epoxy resin having a dielectric constant between 10 and 20 and an electrical volume resistivity of between $1\times10^{15}$ and $5\times10^{15}$ ohm-cm. One useful non-piezoelectric dielectric material is a synthetic epoxy resin having a trademark "Stycast HiK" manufactured by Emmerson and Cummings Corporation. It appears to have an electrical dielectric constant of approximately 15 and a volume resistivity of $2\times10^{15}$ ohm-cm. Titanium oxide particles have been added to the epoxy resin to modify its electrical characteristics as desired.

The back electrode coating 86 has electrode connecting tabs 98 affixed to the coating 86 to enable an oscillating voltage to be applied to the back surface 76. Preferably, the tabs 98 are evenly spaced similarly to the spacing of the tabs 90.

In compliance with the statute, the invention has been described in language more or less specific as to methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. An improved ultrasonic transducer for generating planar ultrasonic waves with reduced edge effect interference, comprising:

a) a thin piezoelectric wafer body having parallel front and back surfaces extending to peripheral front and back edges interconnected by a peripheral surface;

b) a front electrode layer covering the front surface;

c) a back electrode layer covering the back surface;

d) a voltage reduction layer composed of a non-piezoelectric dielectric material interposed between the back surface of the piezoelectric wafer and the back electrode coating along the periphery of the back edge to reduce the effective voltage applied to the piezoelectric wafer adjacent the peripheral surface and thereby reduce the generation of adverse edge effect ultrasonic waves;

e) electrode connector tabs separately affixed to the electrode layers for enabling an oscillating electrical voltage to be applied between the front and rear electrode coatings of the piezoelectric wafer to generate ultrasonic plane waves from the front surface while minimizing the generation of interfering edge effect ultrasonic waves from peripheral surface; and f) wherein the voltage reduction layer has a varying thickness to progressively reduce the voltage applied to the back surface to a minimum adjacent the back edge.

2. The improved ultrasonic transducer as defined in claim 1 wherein the voltage reduction layer has a varying thickness from the back edge to the large central area to progressively reduced the voltage applied to the back surface from a maximum at the large central area to a minimum at the back edge.

3. The improved ultrasonic transducer as defined in claim 1 wherein the back face surface has a minimum surface dimension that is between 30 and 300 times the thickness dimension of the piezoelectric wafer.

4. The improved ultrasonic transducer as defined in claim 1 wherein the back face surface has a minimum surface dimension greater than 1.5 inches.

5. The improved ultrasonic transducer as defined in claim 1 wherein the voltage reduction layer extends inward from adjacent the back edge to a large central area of the back surface to reduce the effective voltage applied to the piezoelectric wafer between the back edge and the large central area.

6. The improved ultrasonic transducer as defined in claim 1 wherein the voltage reduction layer has a varying thickness from the back edge to the large central area to progressively reduced the voltage applied to the back surface from a maximum at the large central area to a minimum at the back edge.

7. The improved ultrasonic transducer as defined in claim 6 wherein the thickness of the voltage reduction layer varies in a Guassian distribution curve from a maximum thickness adjacent the back edge to a minimum thickness at the large central area of the back surface.

8. The improved ultrasonic transducer as defined in claim 1 wherein the thickness of the voltage reduction layer is less than one-fifth of the thickness of the piezoelectric wafer.

9. The improved ultrasonic transducer as defined in claim 1 wherein the thickness of the voltage reduction layer is less than one-tenth of the thickness of the piezoelectric wafer.

10. The improved ultrasonic transducer as defined in claim 1 the non-piezoelectric dielectric material has a dielectric constant less than one-fourth of the dielectric constant of the piezoelectric wafer.

11. The improved ultrasonic transducer as defined in claim 1 the non-piezoelectric dielectric material has a dielectric constant of between one-fourth and one-hundredth of the dielectric constant of the piezoelectric wafer.

12. The improved ultrasonic transducer as defined in claim 1 wherein the non-piezoelectric dielectric material has a dielectric constant value of between 3 and 100.

13. The improved ultrasonic transducer as defined in claim 1 wherein the voltage reduction material comprises a synthetic epoxy resin.

14. The improved ultrasonic transducer as defined in claim 1 wherein the voltage reduction layer has an electrical volume resistivity value of between 0.1 ohm-cm. and $2.5\times10^{15}$ ohm-cm.

15. The improved ultrasonic transducer as defined in claim 1 wherein the voltage reduction layer has an electrical dielectric constant of between 3 and 100 and an electrical volume resistivity value of between 0.1 ohm-cm. and $2.5\times10^{15}$ ohm-cm.

16. The improved ultrasonic transducer as defined in claim 1 wherein the voltage reduction layer comprises an synthetic epoxy resin having a dielectric constant of between 10 and 20 and an electrical volume resistivity of between $1\times10^{15}$ and $5\times10^{15}$ ohm-cm.

17. The improved ultrasonic transducer as defined in claim 1 wherein the back face surface has a minimum surface dimension that is greater than 30 times the thickness dimension of the piezoelectric wafer.

18. The improved ultrasonic transducer as defined in claim 1 wherein the back face surface has a minimum surface dimension that is between 30 and 300 times the thickness dimension of the piezoelectric wafer.

19. The improved ultrasonic transducer as defined in claim 1 wherein the back face surface has a minimum surface dimension greater than 1.5 inches.

20. The improved ultrasonic transducer as defined in claim 1 wherein the voltage reduction layer has a width from the back peripheral edge of greater than 5 times the thickness of the piezoelectric transducer.

21. The improved ultrasonic transducer as defined in claim 1 wherein the voltage reduction layer has a width from the back peripheral edge of between 5 and 20 times the thickness of the piezoelectric transducer.

22. The improved ultrasonic transducer as defined in claim 1 wherein the front and back electrode coatings have a thickness of approximately 0.0003–0.0005 inches.

* * * * *